(12) United States Patent
Chih (10) Patent No.: US 7,495,958 B2
(45) Date of Patent: Feb. 24, 2009

(54) PROGRAM AND ERASE METHODS AND STRUCTURES FOR BYTE-ALTERABLE FLASH MEMORY

(75) Inventor: Yue-Der Chih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 131 days.

(21) Appl. No.: 11/593,398

(22) Filed: Nov. 6, 2006

(65) Prior Publication Data
US 2008/0123416 A1 May 29, 2008

(51) Int. Cl.
*G11C 16/04* (2006.01)
(52) U.S. Cl. ............................. 365/185.13; 365/185.18; 365/185.05
(58) Field of Classification Search ............ 365/185.13, 365/185.18, 185.05
See application file for complete search history.

(56) References Cited

U.S. PATENT DOCUMENTS 6,704,224 B2 * 3/2004 Natori ................... 365/185.18
6,791,883 B2   9/2004 Swift et al.
2006/0028876 A1   2/2006 Quader et al.

OTHER PUBLICATIONS

Cho, M. K., et al., "High Performance SONOS Memory Cells Free of Drain Turn-On and Over-Erase: Compatibility Issue with Current Flash Technology," IEEE Electron Device Letters, Aug. 2000, pp. 399-401, vol. 21, No. 8, IEEE.
Silicon Storage Technology, Inc., "Technology Comparison of Floating Gate Reprogrammable Nonvolatile Memories," Technical Paper, Nov. 2001, 8 pages, Silicon Storage Technology, Inc., Sunnyvale, CA.

* cited by examiner

*Primary Examiner*—Huan Hoang
(74) *Attorney, Agent, or Firm*—Slater & Matsil, L.L.P.

(57) ABSTRACT

An array of flash memory cells arranged in a plurality of rows and a plurality of columns includes a first row comprising a plurality of units. Each unit includes a plurality of flash memory cells, an erase-gate line connecting erase-gates of all flash memory cells in the first row, a source line connecting source nodes of all flash memory cells in the first row, a word line connecting word-line nodes of all flash memory cells in the first row, and a local control-gate (CG) line connecting control-gates of flash memory cells only in the unit, wherein each local CG line is disconnected from remaining local CG lines in the first row. The array further includes bit-lines each connecting bit-line nodes of flash memory cells in a same column.

38 Claims, 5 Drawing Sheets

Fig. 5

PROGRAM AND ERASE METHODS AND STRUCTURES FOR BYTE-ALTERABLE FLASH MEMORY

TECHNICAL FIELD

This invention relates generally to integrated circuits, and more particularly to structures and operating methods of flash memory arrays.

BACKGROUND

Flash memory has become increasingly popular in recent years. A typical flash memory comprises a memory array having a large number of memory cells arranged in blocks. Each of the memory cells is fabricated as a field-effect transistor having a control-gate and a floating gate. The floating gate is capable of holding charges and is separated from source and drain regions contained in a substrate by a layer of thin oxide. Each of the memory cells can be electrically charged by injecting electrons from the drain region through the oxide layer onto the floating gate. The charges can be removed from the floating gate by tunneling the electrons to the source through the oxide layer during an erase operation. The data in a memory cell is thus determined by the presence or absence of a charge on the floating gate.

Figure 1:
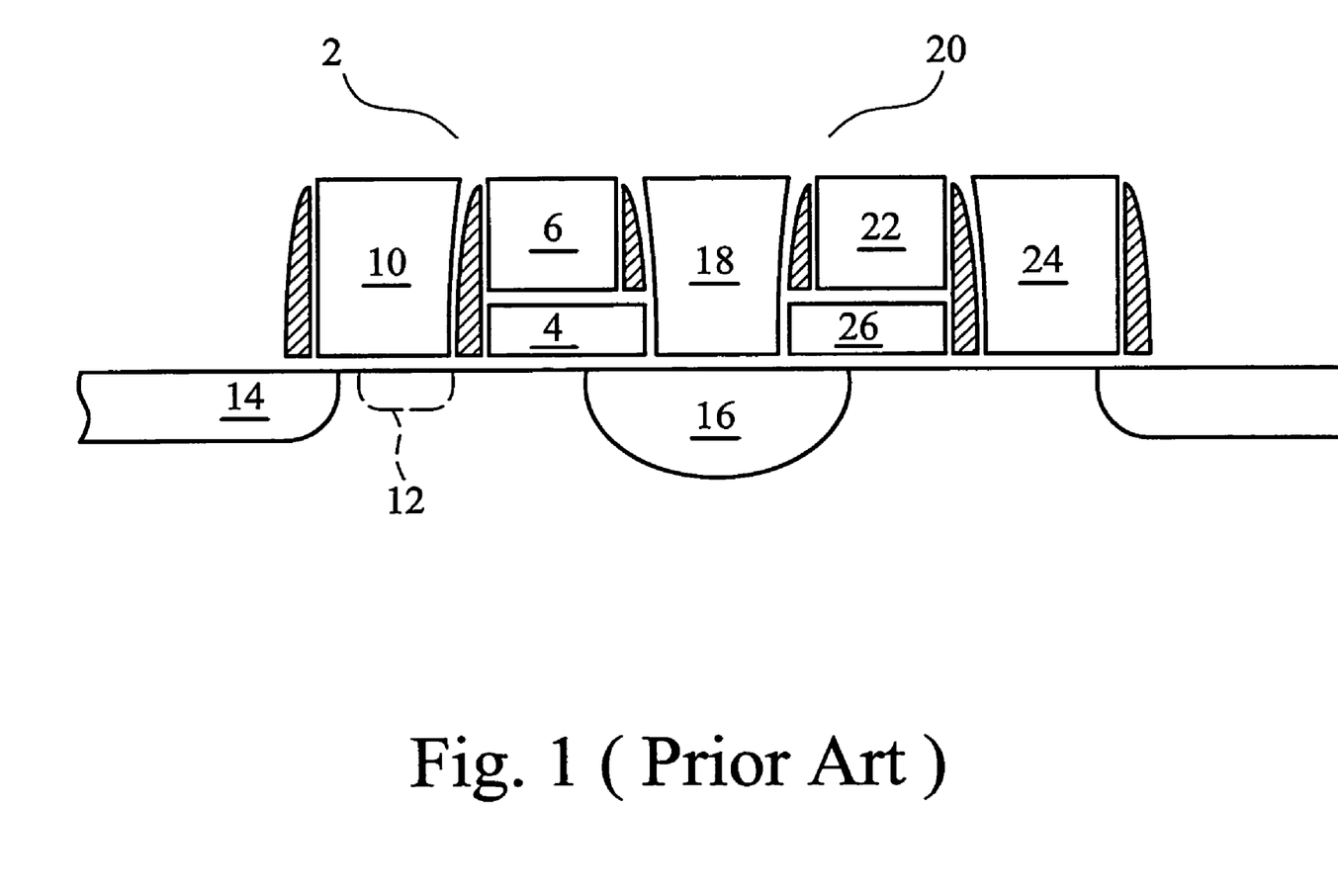
FIG. 1 illustrates two conventional flash memory cells having a common erase-gate.

FIG. 1 illustrates two exemplary flash memory cells 2 and 20. Flash memory cell 2 includes a floating gate 4, a control-gate 6 over and electrically insulated from floating gate 4, and a word-line node 10 over a channel 12 and on sidewalls of floating gate 4 and control-gate 6. Wordline 10 controls the conduction of channel 12, which is between bit-line node 14 and source node 16. During a program operation, a voltage is applied between bit-line node 14 and source node 16, with, for example, a bit-line node voltage of about 0.4V and a source node voltage of about 5V. Wordline 10 is applied with a voltage of 1.1V to turn on channel 12. Therefore, a current (hence electrons) flows between bit-line node 14 and source node 16. A high voltage, for example, about 10V, is applied on control-gate 6, and thus the electrons are programmed into floating gate 4 under the influence of a high electrical field. During an erase operation, a high voltage, for example, 11V, is applied to an erase-gate 18. Word-line node 10 is applied with a low voltage such as 0V, while source node 16, bit-line node 14 and control-gate 6 are applied with a voltage of 0V. Electrons in floating gate 4 are thus driven into erase-gate 18.

Figure 2:
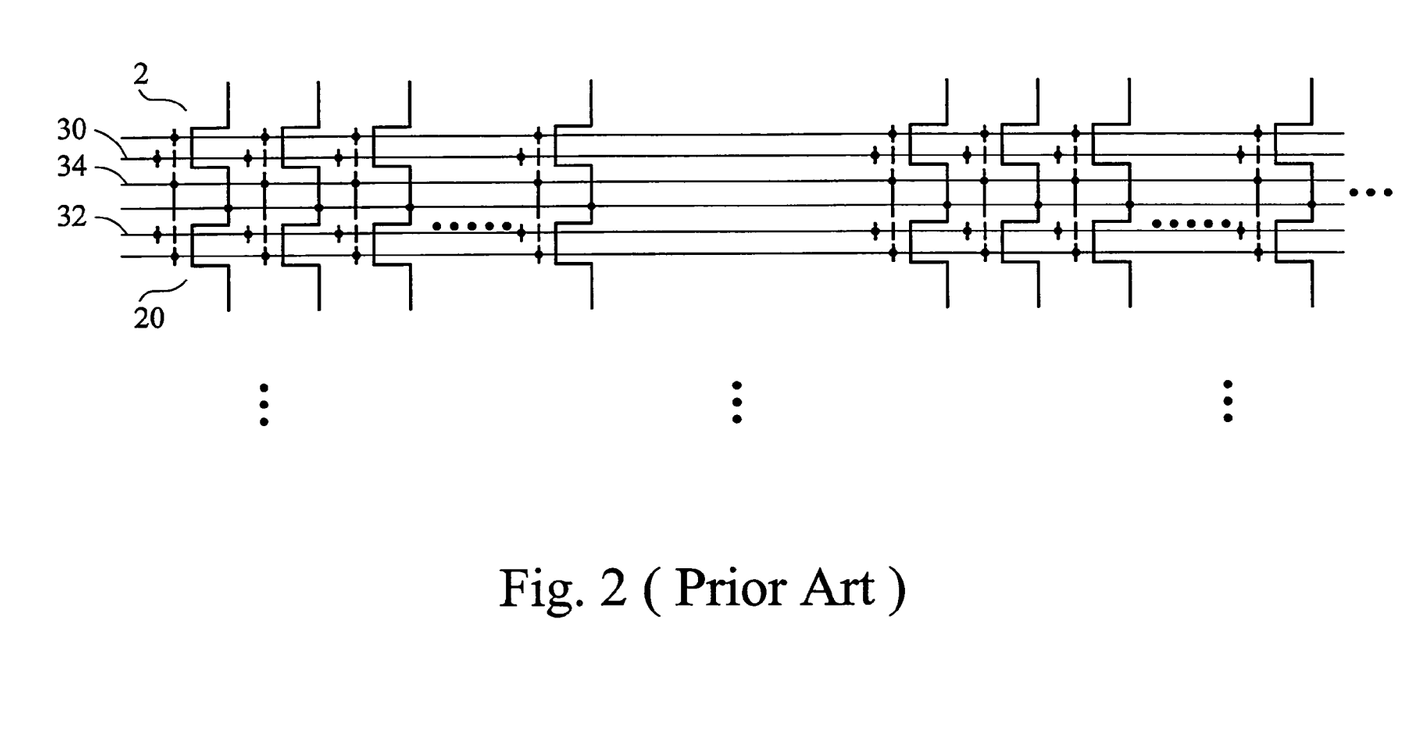
FIG. 2 illustrates a conventional flash memory array, wherein flash memory cells in a row are connected to one control-gate line.

Flash memory cells are placed as rows and columns to form flash memory arrays. FIG. 2 illustrates a conventional flash memory array formed of flash memory cells illustrated in FIG. 1, wherein flash memory cells 2 and 20 are shown as the cells in the first column. The remaining portions of the array are essentially repetitions of memory cells 2 and 20. In each row of the array, there is a global control-gate (CG) line, for example, global CG line 30 in the first row and global CG line 32 in the second row, used by all memory cells in the row. An erase-gate (EG) line 34 is shared by the first row and the second row. In an erase operation, a small portion of a row may need to be erased. However, due to the fact that all memory cells in a row share a common erase-gate, an entire row, and possibly an entire sector, which includes a plurality of rows, has to be erased. Those bytes not intended to be erased have to be written back after the undesirable erase. This not only causes an increase in the overall time for erase operations, but also in a reduction in the lifetime of the flash memory cells due to multiple undesirable program and erase operations. New methods to solve the above-discussed problems are thus needed.

SUMMARY OF THE INVENTION

In accordance with one aspect of the present invention, an array of flash memory cells arranged in a plurality of rows and a plurality of columns includes a first row comprising a plurality of units. Each unit includes a plurality of flash memory cells, an erase-gate line connecting erase-gates of all flash memory cells in the first row, a source line connecting source nodes of all flash memory cells in the first row, a word line connecting word-line nodes of all flash memory cells in the first row, and a local control-gate (CG) line connecting control-gates of flash memory cells only in the unit, wherein each local CG line is disconnected from remaining local CG lines in the first row. The array further includes bit-lines each connecting bit-line nodes of flash memory cells in a same column.

In accordance with another aspect of the present invention, an integrated circuit includes an array of memory cells arranged in a plurality of rows and a plurality of columns. The array includes a plurality of units, each comprising more than one interconnected memory cell, wherein the units are arranged in rows and columns, a plurality of CG lines, each being connected to control-gates of flash memory cells in one of the units wherein local CG lines in one row are disconnected from each other, a plurality of erase-gate lines, each being connected to erase-gates of flash memory cells in a same row, a plurality of source lines, each being connected to source nodes of flash memory cells in a same row, a plurality of bit-lines connected to the columns of memory cells of the array with a bit-line connected to memory cells in a same column, and a plurality of global CG lines, each being connected to local CG lines of units.

In accordance with yet another aspect of the present invention, an array of flash memory cells arranged in a plurality of rows and a plurality of columns includes a first row and a second row comprising common-source flash memory cells sharing a source line and an erase-gate line, wherein the first and the second rows each comprise a plurality of units. Each unit includes a plurality of flash memory cells, the erase-gate line connecting erase-gates of all flash memory cells in the first and the second rows, the source line connecting source line nodes of all flash memory cells in the first and the second rows, a word-line connecting word-line nodes of all flash memory cells in a same row, and a local control-gate (CG) line connecting control-gates of the flash memory cells in the unit, wherein each local CG line is disconnected from remaining local CG lines in a same row, and wherein a local CG line in the first row in disconnected from local CG lines in the second row. The array further includes a plurality of bit-lines each connecting bit-line nodes of flash memory cells in a same column.

In accordance with yet another aspect of the present invention, a method of forming and operating an array of flash memory cells arranged as a plurality of rows and a plurality of columns includes forming a first row comprising a plurality of units, wherein a step of forming each unit in the first row includes forming a plurality of flash memory cells, forming an erase-gate line connecting erase-gates of all flash memory cells in the first row, forming a source line connecting source nodes of all flash memory cells in the first row, forming a word line connecting word-line nodes of all flash memory cells in the first row, forming a local control-gate (CG) line connecting control-gates of flash memory cells in the unit wherein each local CG line is disconnected from remaining local CG lines in the first row, and forming a plurality of bit-lines each connecting bit-line nodes of flash memory cells in a same column.

In accordance with yet another aspect of the present invention, a method of forming an integrated circuit includes an array of memory cells arranged in a plurality of rows and a plurality of columns includes grouping memory cells in the array into a plurality of units, each unit comprising more than one memory cell, wherein the units are arranged in rows and columns, forming a plurality of local control-gate (CG) lines, each one of the plurality connecting control-gates of flash memory cells in one of the units, wherein local CG lines in one row are disconnected from each other, forming a plurality of erase-gate lines, each one of the plurality of erase-gate lines connecting erase-gates of flash memory cells in a same row, forming a plurality of source lines, each one of the plurality of source lines connecting source nodes of flash memory cells in a same row, forming a plurality of bit-lines connecting the columns of memory cells of the array with a bit-line connected to memory cells in a same column, and forming a plurality of global CG lines, each one of the plurality of global CG lines connecting a column of units of the array with a global CG line connected to local CG lines of units in a same column.

A method of operating an array of flash memory cells arranged as a plurality of rows and a plurality of columns includes applying a first voltage to a first local CG line of a first unit of a row, and applying a second voltage different from the first voltage to a second local CG line of a second unit of the row.

The advantageous features of the present invention include reducing undesirable erase and program operations so that not only is the operation time reduced, but the lifetime of the flash memory cells is increased.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 3:
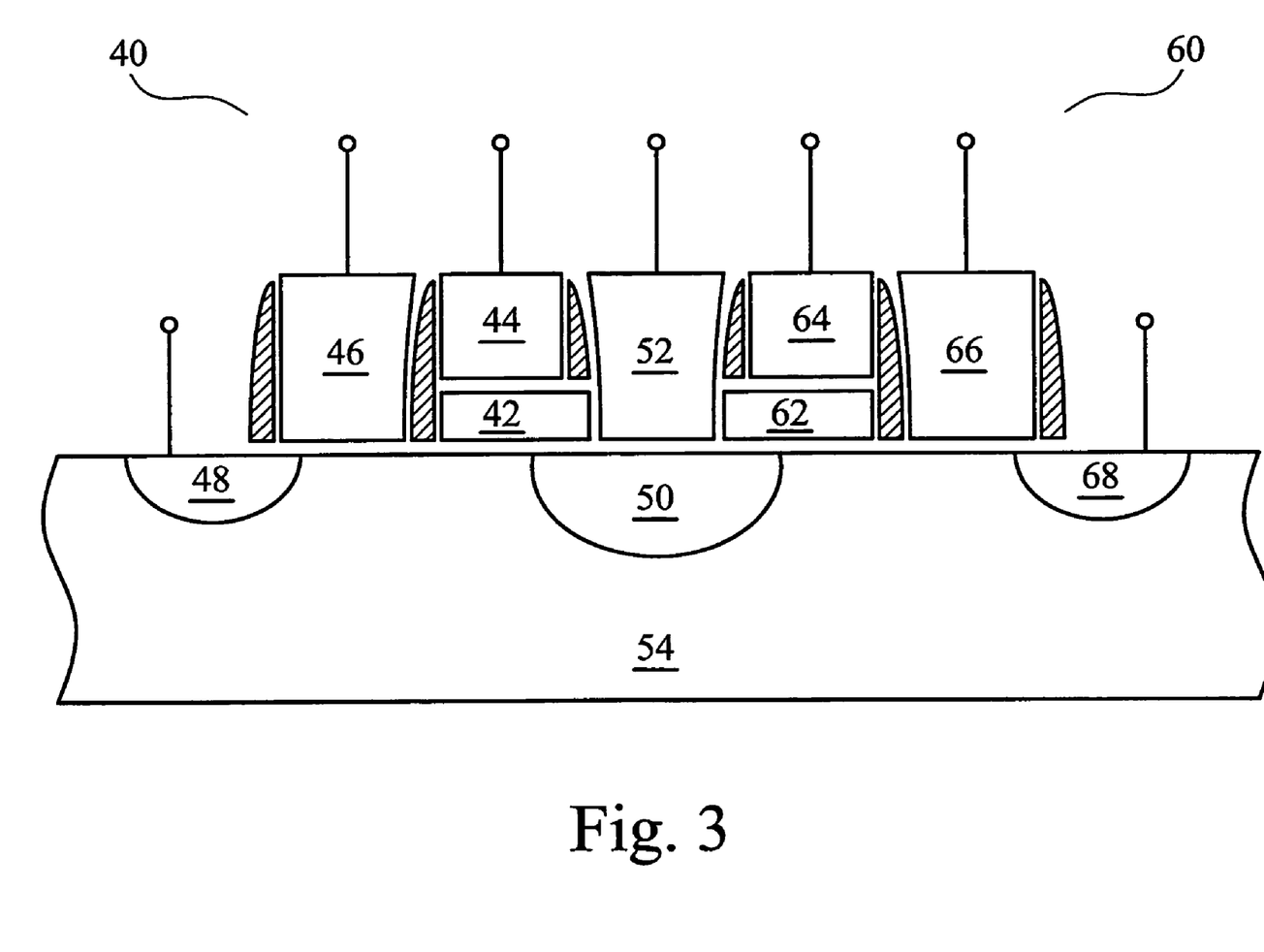
FIGS. 3 and 4 illustrate a common-source flash memory cell pair and a respective symbol.
Figure 4:
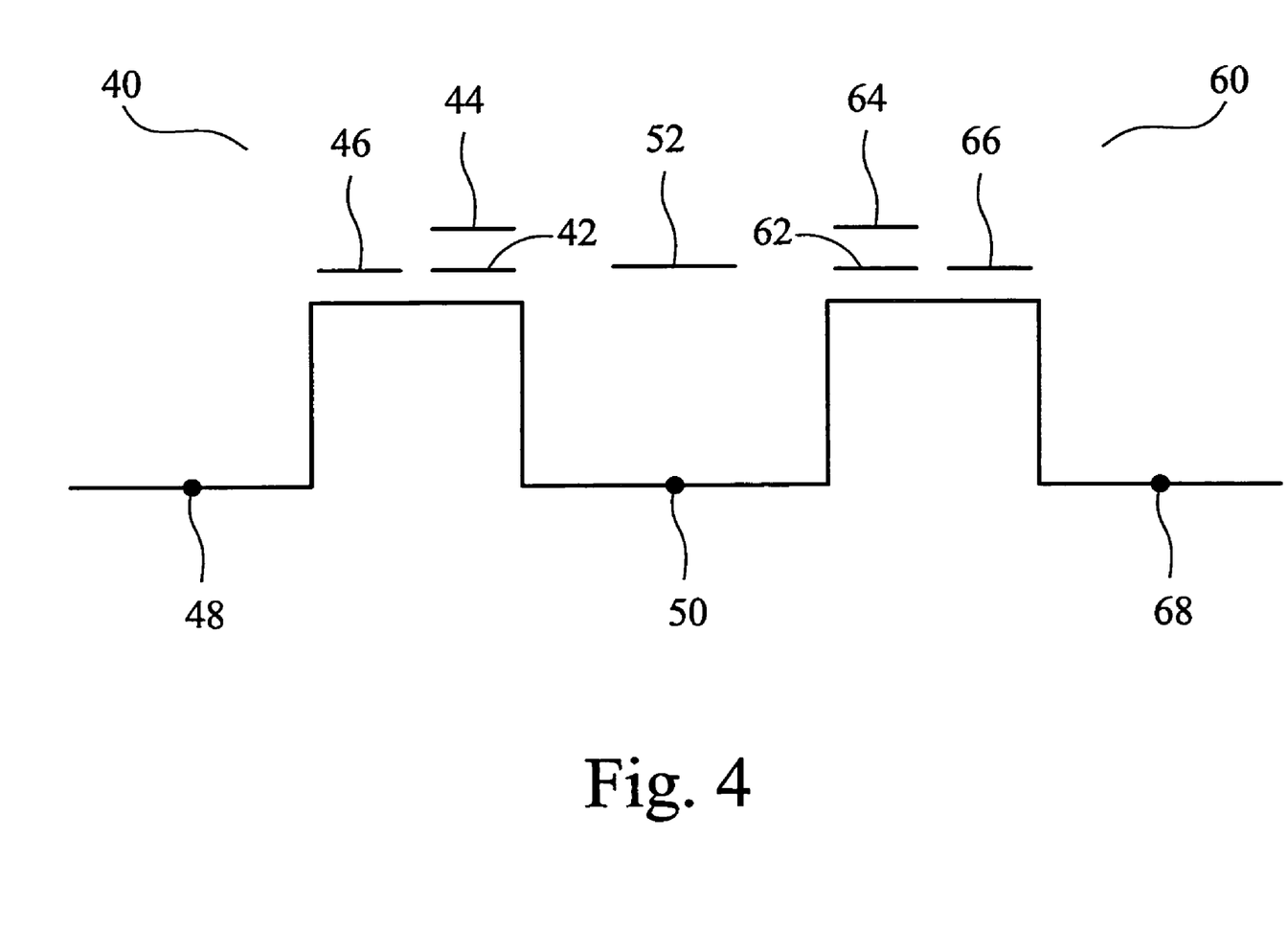

FIG. 3 illustrates a cross-sectional view of an exemplary flash memory cell pair, which is used for the discussion of the embodiments of the present invention. A first flash memory cell 40 includes floating gate 42, control-gate 44 (sometimes referred to as a coupling-gate 44) over floating gate 42, word-line node 46 adjacent sidewalls of floating gate 42 and control-gate 44, and bit-line node 48 and common source node 50 in a substrate 54. A second flash memory cell 60 includes floating gate 62, control-gate 64 over floating gate 62, word-line node 66 adjacent sidewalls of floating gate 62 and control-gate 64, and bit-line node 68 in substrate 54. Flash memory cells 40 and 60 share common source node 50 and erase-gate 52, hence are referred to as common-source flash memory cells. FIG. 4 illustrates a symbol of flash memory cells 40 and 60, wherein like elements may be identified through like reference numbers.

Figure 5:
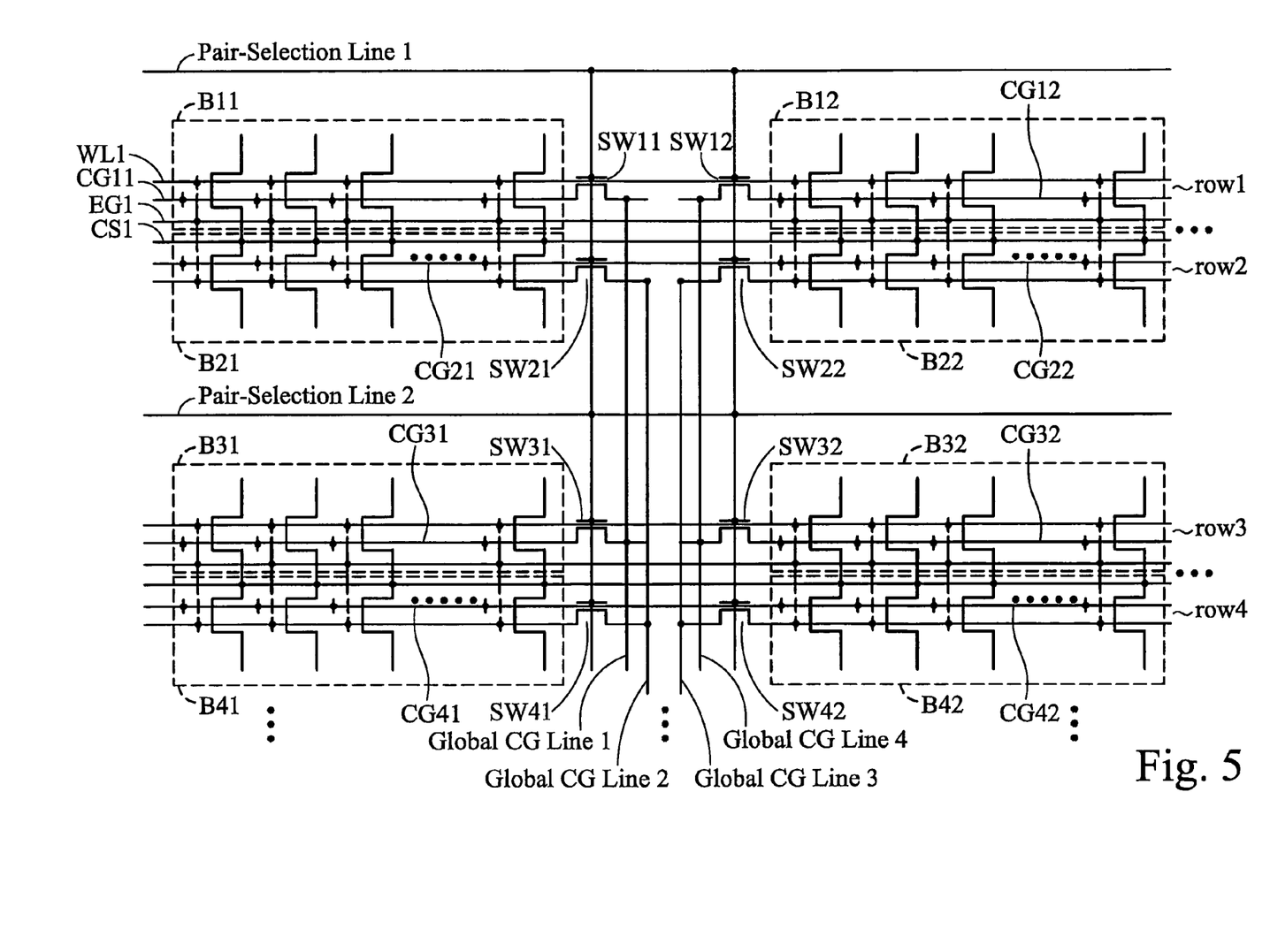
FIG. 5 illustrates an array of the present invention, wherein each byte of the array is connected to one local control-gate line.

FIG. 5 illustrates a preferred embodiment of the present invention, which shows a flash memory array including multiple flash memory cells arranged in rows and columns. Every eight flash memory cells in a row form a byte, and a row typically includes a plurality of bytes. For simplicity, only eight bytes B11, B12, B21, B22, B31, B32, B41 and B42 are illustrated, wherein the first and the second numbers following a letter "B" indicate row number and column number, respectively. The array may be construed by repeating bytes in X and Y directions. Note that the flash memory cell pair in the first and the second rows of the first column is essentially the same as the flash memory cell pair illustrated in FIG. 4, although a flash memory array may include other types of flash memory cells than that shown in FIG. 5.

In each row of the flash memory array, a word-line, for example, word-line WL1 in the first row, connects word-line nodes of all flash memory cells in the same row. An erase-gate line, for example, erase-gate line EG1, connects erase-gates of all flash memory cells in the same row. Similarly, a source line, for example, source line CS1, connects source nodes of all flash memory cells in the same row. Each of the erase-gate lines and source lines is preferably shared by two neighboring rows having common-source flash memory cells. Each column includes a bit-line (not shown) connecting bit-line nodes of flash memory cells in the same column.

In each byte, a local control-gate (CG) line connects control-gates of all eight flash memory cells. Since each row includes a plurality of bytes, there are a plurality of local CG lines in each row, each being laid out in X direction and disconnected from others. The local CG lines are also named with the respective row number and column number, such as CG lines CG11, CG12, CG21, CG22, CG31, CG32, CG41 and CG42 as illustrated in FIG. 5. Each of the local CG lines is connected to one of the global CG lines, such as global CG line 1 through global CG line 4, which are preferably laid out in Y direction. Assuming each row includes N bytes, wherein N is an integer greater than one, since the N bytes are all disconnected from each other, N global CG lines are required for connecting N bytes in a row.

Furthermore, the local CG lines of two bytes having common-source flash memory cells (referred to as common-source bytes hereinafter) in neighboring rows are preferably disconnected from each other. Since common-source bytes are laid out in neighboring rows, a global CG line may be connected to local CG lines of alternating rows. In an exemplary embodiment as shown in FIG. 5, global CG line 1 connects the local CG lines of the first bytes in row 1 and row 3, and global CG line 2 connects the local CG lines of the first bytes in row 2 and row 4. Similarly, global CG line 4 connects the local CG lines of the second bytes in row 1 and row 3, and global CG line 3 connects the local CG lines of the second bytes in row 2 and row 4.

In the preferred embodiment, each global CG line is connected to all respective local CG lines in alternating rows. Therefore, if there are N bytes in each row, the minimum number of global CG lines is 2N. It is to be realized, however, that a memory array may be divided into sectors with each sector including more than one row. One global CG line may be used to connect local CG lines in one sector only and is disconnected from local CG lines in other sectors, although such a connecting scheme requires more global CG lines.

The connections between global CG lines and local CG lines are controlled by switches SW11, SW12, SW21 and SW22, etc. In an exemplary embodiment, switches SW11, SW12, SW21 and SW22 are MOS devices. The switches in each row are controlled by a pair-selection line. Two neighboring rows with common-source memory cells, such as rows 1 and 2, are referred to as a row pair, and are preferably controlled by a same pair-selection line 1. If a selected unit is in a row, the pair of rows including the selected row is referred to as a selected pair. Global CG lines and pair-selection lines are combined to control the voltages on each individual byte.

An advantageous feature of the present invention is that each byte may be individually erased or programmed as a unit. As a comparison, in a conventional flash memory array, a sector of flash memory cells is typically erased as a unit. Being able to erase and program an individual byte without affecting other bytes significantly reduces undesired erase operations, and thus the re-program operations of those undesirably erased bytes. Accordingly, the erase operations are accelerated, and the lifetime of the flash memory cells is prolonged. Throughout the description, if a program or erase operation is to be performed on a byte, the byte is referred to as a selected byte, and the bytes on which the program or erase operation is not to be performed are referred to as unselected bytes. Accordingly, the row and the column having the selected byte are referred to as a selected row and a selected column, respectively.

In an erase operation of a selected byte, for example, byte B11, a high voltage, such as 11V, is applied to erase-gate line EG1, while local control-gate line CG11, word-line WL1, and source line CS1 preferably have a low voltage such as 0V applied thereon. Pair-selection line 1 is applied with a high voltage such as 11V to turn on switch SW11. Pair-selection lines of unselected row pairs are applied with a low voltage such as 0V, and thus the local CG lines of the unselected row pairs are disconnected from the respective CG lines the switches. A high voltage needs to be applied to global CG line 1. The eight bit-lines (not shown) connected to the flash memory cells in byte B11 are preferably connected to a low voltage, such as 0V. Referring back to FIG. 3, assuming flash memory cell 40 is one of the flash memory cells in the selected byte B11, a coupled voltage on floating gate 42 is low due to low voltages on control-gate 44 and source node 50. Since erase-gate 52 has a voltage significantly higher than the voltage coupled to floating gate 42, electrons tunnel into erase-gate 52 from floating gate 42, hence flash memory cell 40 is erased. Referring back to FIG. 5, since all flash memory cells in byte B11 are interconnected to same voltages, all eight bytes are erased simultaneously.

At the time the selected byte B11 is erased, unselected bytes such as B12, B21 and B22 preferably are not erased. Accordingly, the respective global CG line 4, global CG line 2, and global CG line 3 are connected to high voltages, such as 10V. As a result, flash memory cells in the unselected bytes are not erased. The mechanism is explained using FIG. 3 as follows. Assuming flash memory cell 60 in FIG. 3 represents a flash memory cell in an unselected byte in the selected row pair, during an erase operation of byte B11, erase-gate 52 is at 11V since it is connected to the same erase-gate line as the selected byte B11. Since control-gate 64 is connected to a high voltage, such as 11V, floating gate 62 will be coupled with a higher voltage also, wherein the voltage level on floating gate 62 is determined partially by the voltage on substrate 54, the voltage on control-gate 64, and the ratio of a capacitor formed between substrate 54 and floating gate 62 and a capacitor formed between floating gate 62 and control-gate 64. The elevated voltage on floating gate 62 results in a reduced voltage difference between erase-gate 52 and floating gate 62. The voltage difference is lower than a voltage needed for tunneling, for example, Folwer-Nordheim (FN) tunneling, to occur, and thus unselected bytes are not erased. For bytes in unselected row pairs (such as row 3), the respective pair-selection lines (such as pair-selection line 2) are applied with a low voltage such as 0V, and thus the respective switches are turned off. Accordingly, the high voltage of the global lines are not applied to these bytes, and both EG lines and local CG lines of the bytes in unselected rows are at low voltages, and hence no erasing occurs.

In a program operation of a selected byte, for example, byte B11, a high voltage, such as 10V, is applied to local control-gate line CG11. Pair-selection line 1 is applied with a high voltage such as 11V to turn on switch SW11. Pair-selection lines of unselected row pairs are applied with a low voltage such as 0V, and thus the respective local CG lines are not connected to the respective global CG lines. A high voltage needs to be applied to global CG line 1. A voltage is applied on word-line WL1 to turn on channels of the flash memory cells, while erase-gate line EG1 is applied with a low voltage, such as 0V. A voltage may be applied between source line CS1 and bit-lines (not shown) of the eight flash memory cells in byte B11, wherein the desired voltages applied on the bit-lines depend on the desired states to be programmed. Referring to FIG. 3, and assuming flash memory cell 40 is one of the flash memory cells in byte B11, the voltage applied between common-source node 50 and bit-line node 48 causes a channel current. Since a higher voltage is applied on control-gate 44, electrons tunnel into floating gate 42 through a tunneling layer (not shown) between substrate 54 and floating gate 42 by, for example, a hot electron injection (HEI) mechanism, hence flash memory cell 40 is programmed. Referring back to FIG. 5, since all flash memory cells in byte B11 are interconnected to same voltages, all eight bytes can be programmed simultaneously, and the programming of each bit in byte B11 depends on the voltages on the respective bit-lines.

At the time the selected byte B11 is programmed, unselected bytes of the selected row pairs, such as B12, B21 and B22 are preferably not programmed. Accordingly, the respective global CG line 4, global CG line 2, and global CG line 3 are connected to low voltages, such as 0V. The mechanism is explained using FIG. 3 as follows. Assuming flash memory cell 40 in FIG. 3 represents a flash memory cell in an unselected byte of a selected row pair, during a program operation of byte B11, common source node 50 is at 5V since it is connected to the same source line as the selected byte B11. Since control-gate 44 is connected to a low voltage, such as 0V, there is no electrical field to drive electrons into floating gate 42. Similar analysis will reveal that other unselected units in different rows as the selected unit are also not programmed, either due to a low control-gate voltage, or to no voltage being applied on respective word-lines. For bytes in unselected row pairs, since the respective pair-selection line is applied with the low voltage, low voltages are applied to local CG lines of bytes in unselected row pairs, and hence no programming occurs.

In a read operation of a selected byte, for example, byte B11, a moderate voltage, such as operation voltage VCC, which may be about 2.5V in 90 nm technology, is applied to local control-gate line CG11, and a moderate low voltage is applied on word-line WL1 to turn on channels, while erase-gate line EG1 is applied with a lower voltage, such as 0V. A low voltage, which is greater than 0V, is applied to bit-lines connected to byte B11. The voltages or currents on the bit-lines are monitored to determine the state of the flash memory cells in byte B11. For unselected bytes of the unselected row pairs, all of the lines including the local CG line, erase-gate line, source line, bit-line and word-line are preferably connected to 0V, unless the respective lines are shared with the selected byte B11. Similar to erase and program operations, the pair-selection line of the selected row pair is applied with a voltage that can turn on the respective switch, while pair-selection lines of the unselected row pairs are applied with a low voltage so that the switches are turned off.

Table 1 provides examples of the voltages provided to selected and unselected bytes of the memory array. Please note that the voltages in Table 1 are merely examples, and the appropriate voltages depend on the design of the flash memory cells. The symbol "Sel" represents selected bytes, while the symbol "Unsel" represents unselected bytes. The term "unselected row" refers to a row neighboring and sharing common-source flash memory cells with the selected row, while the term "Unselected sector" refers to any two neighboring rows that share common-source flash memory cells with each other, but that do not share common-source flash memory cells with the selected row.

TABLE 1

| Operation | Cell | EG | Global CG | WL | CS | BL |
|---|---|---|---|---|---|---|
| Erase | Sel | 11 V | 0 V | 0 V | 0 V | 0 V |
| | Unsel | 0 V | 10 V | 0 V | 0 V | 0 V |
| Program | Sel | 0 V | 10 V | 1.1 V | 5 V | 0.4 V |
| | Unsel (Unselected row) | 0 V | 0 V | 0 V | 5 V | VCC |
| | Unsel (Unselected Sector) | 0 V | 0 V | 0 V | 0 V | VCC |
| Read | Sel | 0 V | 2.5 V | 2.5 V | 0 V | 0.8 V |
| | Unsel | 0 V | 0 V | 0 V | 0 V | 0 V |

In the embodiments discussed in the preceding paragraphs, each local control line is connected to eight flash memory cells. In an alternative embodiment, each local control line may be connected to more than or less than eight flash memory cells. When more than eight flash memory cells are controlled by one local CG line, each erase or program operation may be performed to more than one byte. The required number of local CG lines and global CG lines is reduced. However, more flash memory cells will be undesirably erased. When less than eight flash memory cells are connected to one local CG line, the number of undesirably erased flash memory cells is reduced. However, the required number of local CG lines and global CG lines is increased. One skilled in the art may determine an optimal scheme based on design requirements.

In the preferred embodiments of the present invention, although common-source flash memory cells are used to form the memory array, the concept of the present invention is readily available for memory arrays having no common-source flash memory cells. One skilled in the art will realize the respective connection schemes.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An array of flash memory cells arranged in a plurality of rows and a plurality of columns, the array comprising:
    a first row comprising a plurality of units, wherein each unit comprises:
        a plurality of flash memory cells;
        an erase-gate line connecting erase-gates of all flash memory cells in the first row;
        a source line connecting source nodes of all flash memory cells in the first row;
        a word line connecting word-line nodes of all flash memory cells in the first row; and
        a local control-gate (CG) line connecting control-gates of flash memory cells in the unit, wherein each local CG line is disconnected from remaining local CG lines in the first row; and
    bit-lines connecting bit-line nodes of flash memory cells in a same column.

2. The array of claim 1, wherein each local CG line is connected to a global CG line through a switch.

3. The array of claim 2, wherein the switch is controlled by a pair-selection line.

4. The array of claim 2, wherein each global CG line is laid out in a direction perpendicular to a direction in which a local CG line is laid out.

5. The array of claim 2, wherein each global CG line is connected to local CG lines in alternating rows.

6. The array of claim 1 further comprising a second row comprising a plurality of units, wherein the first row and the second row comprise common-source flash memory cells, and wherein the first and the second row share a common erase-gate line, a common source line, and a common pair-selection line.

7. The array of claim 6, wherein local CG lines in the first row are disconnected from local CG lines in the second row.

8. The array of claim 1, wherein each unit consists of a byte of flash memory cells.

9. The array of claim 1, wherein a flash memory cell in the array comprises:
    a floating gate over a substrate;
    a control-gate over and electrically insulated from the floating gate;
    a word-line node on sidewalls of and electrically insulated from the floating gate and the control-gate;

a bit-line node in the substrate and adjacent the word-line node;

an erase-gate on sidewalls of the floating gate and the control-gate, wherein the erase-gate is electrically insulated from the floating gate and the control-gate, and wherein the erase-gate is on an opposite side of the floating gate and the control-gate than the word-line node; and a source node in the substrate and substantially underlying the erase-gate.

10. The array of claim 8 further comprising a common-source flash memory cell sharing the erase-gate and the source node with the flash memory cell.

11. An integrated circuit comprising:

an array of memory cells arranged in a plurality of rows and a plurality of columns, the array comprising:

a plurality of units, each unit comprising more than one interconnected memory cell, wherein the units are arranged in rows and columns;

a plurality of local control-gate (CG) lines, each being connected to control-gates of flash memory cells in one of the units, wherein local CG lines in one row are disconnected from each other;

a plurality of erase-gate lines, each erase-gate line being connected to erase-gates of flash memory cells in a same row;

a plurality of source lines, each source line being connected to source nodes of flash memory cells in a same row;

a plurality of bit-lines connected to the columns of memory cells of the array with a bit-line connected to memory cells in a same column; and a plurality of global CG lines, each global CG line being connected to local CG lines of units.

12. The integrated circuit of claim 11, wherein two neighboring units in neighboring rows comprise common-source flash memory cells, and wherein a global CG line is connected to only one of the two neighboring units.

13. The integrated circuit of claim 12, wherein a local CG line of a unit is connected to one of the global CG lines through a switch, and wherein switches of neighboring rows having common source memory cells are connected to a same pair-selection line.

14. The integrated circuit of claim 12, wherein each of the global CG lines is connected to the local CG lines in alternating rows.

15. The integrated circuit of claim 11, wherein each unit comprises eight flash memory cells.

16. The integrated circuit of claim 11, wherein the local CG lines, the word-lines, the erase-gate lines, and the source lines are arranged in a first direction, and wherein the bit-lines and the global CG lines are arranged in a second direction perpendicular to the first direction.

17. An array of flash memory cells arranged in a plurality of rows and a plurality of columns, the array comprising:

a first row and a second row comprising common-source flash memory cells and sharing a source line and an erase-gate line, wherein the first and the second rows each comprise a plurality of units, and wherein each unit comprises:

a plurality of flash memory cells;

the erase-gate line connecting erase-gates of all flash memory cells in the first and the second rows;

the source line connecting source line nodes of all flash memory cells in the first and the second rows;

a word-line connecting word-line nodes of all flash memory cells in a same row; and a local control-gate (CG) line connecting control-gates of the flash memory cells in the unit, wherein each local CG line is disconnected from remaining local CG lines in a same row, and wherein a local CG line in the first row is disconnected from local CG lines in the second row; and a plurality of bit-lines each connecting bit-line nodes of flash memory cells in a same column.

18. The array of claim 17, wherein each local CG line is connected to a global CG line, and wherein the global CG line is connected to local CG lines of a plurality of units in same columns.

19. The array of claim 18 further comprising a pair-selection line, wherein the local CG line of the first row is connected to a respective global CG line through a first switch, the local CG line of the second row is connected to a respective global CG line through a second switch, and wherein the first and the second switches are controlled by the pair-selection line.

20. The array of claim 18, wherein the global CG line is connected only to local CG lines in alternating rows.

21. The array of claim 17, wherein each unit consists of eight flash memory cells.

22. A method of forming and operating an array of flash memory cells arranged as a plurality of rows and a plurality of columns comprising:

forming a first row comprising a plurality of units, wherein steps of forming each unit in the first row comprise:

forming a plurality of flash memory cells;

forming an erase-gate line connecting erase-gates of all flash memory cells in the first row;

forming a source line connecting source nodes of all flash memory cells in the first row;

forming a word line connecting word-line nodes of all flash memory cells in the first row;

forming a local control-gate (CG) line connecting control-gates of flash memory cells in the unit, wherein each local CG line is disconnected from remaining local CG lines in the first row; and forming a plurality of bit-lines each connecting bit-line nodes of flash memory cells in a same column.

23. The method of claim 22 further comprising connecting each of a plurality of global CG lines to the array with one global CG line connected to one of the local CG lines in the first row.

24. The method of claim 23 further comprising connecting a switch between each local CG line and a respective global CG line, wherein switches of common-source units are controlled by a same pair-selection line.

25. The method of claim 22 further comprising erasing a selected unit in the first row, wherein steps of erasing a selected unit comprise:

applying a high voltage to the erase-gate line of the first row;

applying a low voltage to a local CG line of the selected unit; and applying a high voltage only to local CG lines of unselected units in the first row.

26. The method of claim 22 further comprising forming a second row neighboring the first row, wherein the first and the second rows have common-source flash memory cells, and wherein the method further comprises applying a high voltage to local CG lines of unselected units in the second row.

27. The method of claim 22 further comprising forming a third row, wherein the first and the third rows have no common-source flash memory cells, and wherein the method further comprises applying a low voltage to local CG lines of unselected units in the third row.

28. The method of claim 22 further comprising programming a selected unit in the first row, wherein the step of programming the selected unit comprises:
   applying a high voltage to a local CG line of the selected unit;
   applying a voltage between the erase-gate line of the first row and bit-lines connected to flash memory cells in the selected unit; and
   applying a low voltage to local CG lines of unselected units.

29. A method of forming an integrated circuit comprising:
   forming an array of memory cells arranged in a plurality of rows and a plurality of columns comprising:
      grouping memory cells in the array into a plurality of units, each comprising more than one memory cell, wherein the units are arranged in rows and columns;
      forming a plurality of local control-gate (CG) lines, each one of the plurality connecting control-gates of flash memory cells in one of the units, wherein local CG lines in one row are disconnected from each other;
      forming a plurality of erase-gate lines, each one of the plurality connecting erase-gates of flash memory cells in a same row;
      forming a plurality of source lines, each one of the plurality connecting source nodes of flash memory cells in a same row;
      forming a plurality of bit-lines connecting the columns of memory cells of the array with a bit-line connected to memory cells in a same column; and
      forming a plurality of global CG lines, each one of the plurality connecting a column of units of the array with a global CG line connected to local CG lines of units in a same column.

30. The method of claim 29 further comprising, during an erase operation:
   applying a high voltage to an erase-gate line connected to a selected unit;
   applying a low voltage to a global CG line connected to the selected unit; and
   applying a high voltage to global CG lines connected to unselected units.

31. The method of claim 29 further comprising, during a program operation, applying a high voltage to a global CG line connected to a selected unit, and applying a low voltage to global CG lines connected to unselected units in a same row as the selected unit.

32. The method of claim 29 further comprising, during a read operation, applying a first voltage to a global CG line connected to a selected unit, and applying a second voltage lower than the first voltage to global CG lines connected to unselected units.

33. The method of claim 29, wherein each unit comprises eight flash memory cells.

34. The method of claim 29, wherein each of the global CG lines is connected to local CG lines in alternating rows.

35. A method of operating an array of flash memory cells arranged as a plurality of rows and a plurality of columns, the method comprising:
   connecting a first local control-gate (CG) line to a first unit of a row;
   connecting a second local CG line to a second unit of the row;
   applying a first voltage to first global CG line;
   applying a second voltage different from the first voltage to a second global CG line, wherein the first and the second global CG lines connect the first and the second voltages to the first and the second local CG lines, respectively; and
   controlling a connection between the first local CG line and the first global CG line through a switch, wherein the switch is controlled by a pair-selection line, and wherein the pair-selection line further controls an additional switch connected to an additional unit having common-sources with the first unit.

36. The method of claim 35 further comprising, during an erase operation of the first unit but not the second unit:
   applying a high voltage to an erase-gate line connected to the first unit;
   applying a low voltage to the first global CG line; and
   applying a high voltage to the second global CG line.

37. The method of claim 35 further comprising, during a program operation of the first unit but not the second unit, applying a high voltage to the first global CG line, and applying a low voltage to the second global CG line.

38. The method of claim 35 further comprising, during a read operation of the first unit, but not the second unit, applying a first voltage to the first global CG line, and applying a second voltage lower than the first voltage to the second global CG line.

* * * * *